United States Patent [19]

Kawamura et al.

[11] Patent Number: 5,774,334
[45] Date of Patent: Jun. 30, 1998

[54] LOW THERMAL RESISTANT, FLUID-COOLED SEMICONDUCTOR MODULE

[75] Inventors: Keizo Kawamura, Ibaraki-ken; Noriyuki Ashiwake, Tsuchiura; Takahiro Daikoku, Ushiku; Akio Idei, Hadano; Kenichi Kasai, Ushiku; Hideyuki Kimura, Tsuchiura; Atsuo Nishihara, Inayo; Toshio Hatada, Tsuchiura; Shigeyuki Sasaki, Ibaraki-ken, all of Japan

[73] Assignee: Hitachi, Ltd., Japan

[21] Appl. No.: 520,338

[22] Filed: Aug. 28, 1995

[30] Foreign Application Priority Data

Aug. 26, 1994 [JP] Japan .................................. 6-202217

[51] Int. Cl.⁶ ....................................................... H05K 7/20
[52] U.S. Cl. ......................... 361/699; 165/80.4; 257/714
[58] Field of Search ................................. 165/80.2–80.4, 165/185; 174/16.3; 257/714; 361/688–690, 698–699, 703–704, 707, 715, 717–718, 722

[56] References Cited

U.S. PATENT DOCUMENTS

| | | |
|---|---|---|
| 4,498,530 | 2/1985 | Lipschutz . |
| 4,770,242 | 9/1988 | Daikoku et al. ......................... 165/185 |
| 4,800,956 | 1/1989 | Hamburgen . |
| 5,048,599 | 9/1991 | Tustaniwskyj et al. ................. 361/698 |
| 5,201,866 | 4/1993 | Mok ........................................ 165/80.3 |
| 5,345,107 | 9/1994 | Daikoku et al. ......................... 257/714 |

FOREIGN PATENT DOCUMENTS 57-10337 12/1980 Japan .
60-126853 12/1983 Japan .

OTHER PUBLICATIONS

IBM System/390 Air–Cooled Alumina Thermal Conduction Module; J. U. Knickerbocker et al.; IBM J. Res. Develop. vol. 35, No. 3, May 1991; pp. 330–341 and 349.

Primary Examiner—Gregory D. Thompson
Attorney, Agent, or Firm—Evenson, McKeown Edwards & Lenahan, P.L.L.C.

[57] ABSTRACT

Semiconductor devices are fixed on a substrate by solder and a semiconductor module having an enclosed structure is formed by the substrate, flanges and a housing. Two groups of heat conducting members, each having fins respectively in contract with the semiconductor devices and an inner wall of the housing are attached to the semiconductors. A fin thickness of each fin of the two groups of heat conducting members is comparatively thick, a fin height is low and the respective fins of the respective opposed heat conducting members have with very small clearances therebetween. A liquid as a heat conducting medium is enclosed in the semiconductor module. The liquid level of the semiconductor module is controlled such that it contacts a uppermost semiconductor device in the semiconductor module in a vertical arrangement. Further, valve mechanisms for introducing and removing a cooling fluid are provided at a top face and a bottom face of a space formed in the semiconductor module. The mass production capability of the heat conducting members is improved by providing such highly rigid fins, and improved cooling function is provided by firmly introducing the cooling medium to the respective fins while permitting the module to be reduced in size.

15 Claims, 8 Drawing Sheets

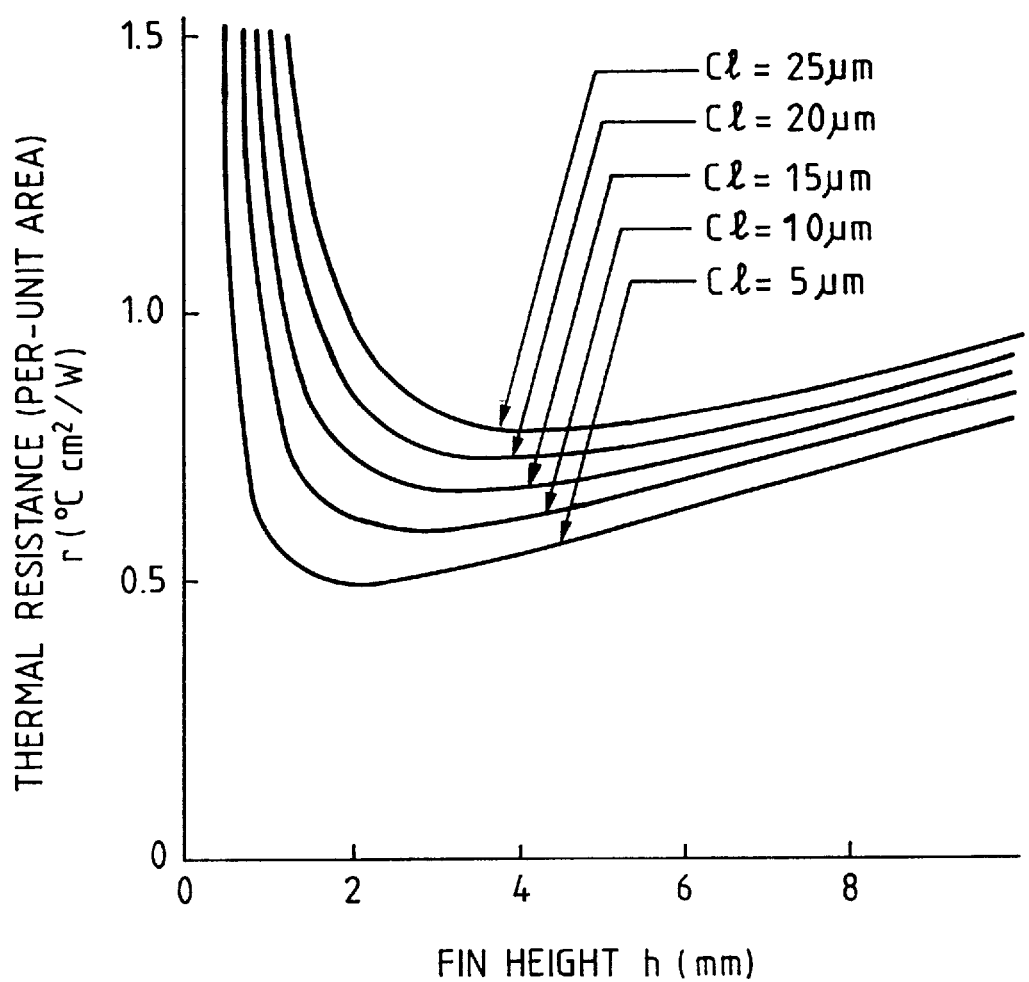

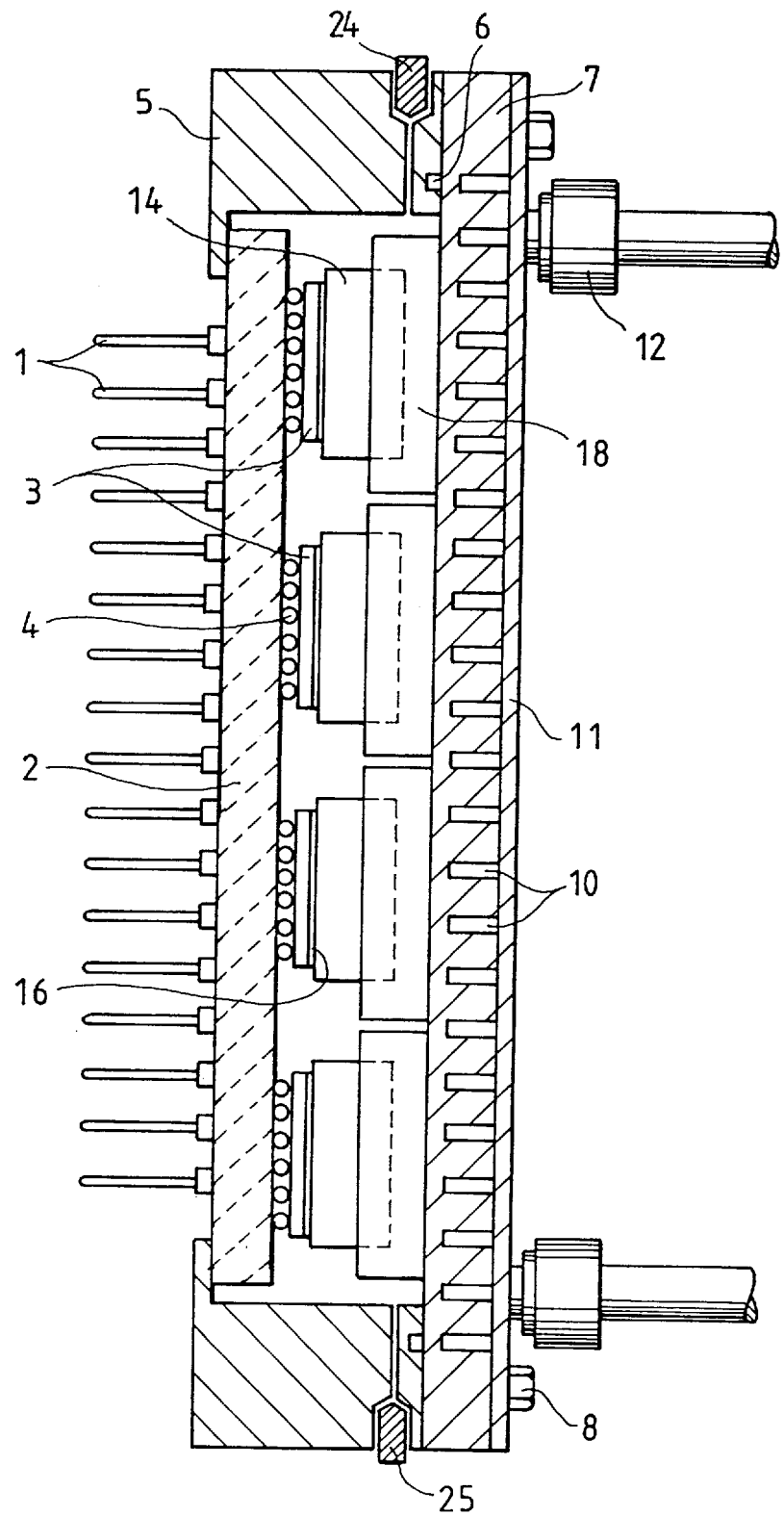

LOW THERMAL RESISTANT, FLUID-COOLED SEMICONDUCTOR MODULE

BACKGROUND AND SUMMARY OF THE INVENTION

The present invention relates to a low thermal resistant, fluid-cooled semiconductor module, particularly to a semiconductor module suitable for an electronic apparatus having a high heat flux such as a large scale computer, a super-computer and the like.

Generally, surfaces of semiconductor devices mounted on a circuit board are not on the same plane but have different heights and also different inclinations due to poor assembling accuracy. Further, the temperature of the semiconductor devices differs between their operating state and non-operating state; therefore, a thermal deformation is caused and the differences in the heights and the inclinations differ between the operating state and the non-operating state. This is the reason why flexible heat conducting bodies are used in cooling semiconductor devices. It is the function of the flexible heat conducting bodies to transfer heat generated in the semiconductor devices to the housing while absorbing static and dynamic deformation due to the poor assembling accuracy or to the thermal deformation. The flexible heat conducting bodies are required to have flexibility as well as small thermal resistance. Moreover, it is also extremely important from a practical point of view have excellent mass production capability.

A semiconductor module having a structure wherein flexible heat conducting bodies are provided between semiconductor devices and a housing and heat generated at the semiconductor devices is transferred to the housing via the heat conducting bodies, is disclosed, for example, in Japanese Unexamined Patent Publication No. 57-103337 (1982). In this publication, the heat conducting bodies are mutually combined plane fins which are fixed to semiconductor chips and an inner wall of the housing.

Japanese Unexamined Patent Publication No. 60-126853 (1985) also discloses a structure wherein heat conducting bodies of mutually combined plate fins are pushed on faces of semiconductor chips by springs. U.S. Pat. No. 4,800,956 discloses a structure wherein heat conducting bodies having mutually combined plate fins are fixed to semiconductor chips and an inner wall of a housing. U.S. Pat. No. 4,498,530 discloses a structure wherein heat conducting bodies having mutually combined flexible plate fins are in contact with both of semiconductor chips and an inner wall of a housing.

To remove generated heat in semiconductor devices more effectively, an example wherein oil is used as a heat conducting medium in bringing a metal piston in contact with the semiconductor devices is described in IBM Journal of Research and Development Vol. 35, No. 3 (1991).

For reliability, it is necessary to keep the temperature of a semiconductor device normally to below 80° through 90° C. The room temperature or the temperature of cooling water is normally around 25° through 30° C. and, therefore, an allowable temperature rise from the room temperature or the temperature of cooling water is approximately 50° through 65° C.

A low thermal resistance value has not been required in the above-mentioned known flexible heat conducting bodies because the heat flux of a conventional semiconductor module is approximately 10 W/cm². However, the amount of generated heat in a semiconductor module has been increasing year by year, and we foresee that the amount will reach a level of 50 W/cm² in the near future. It will be extremely difficult to cool a module having such a high heat flux by the conventional technology, and an increasing concern will be how to achieve a considerably lower thermal resistance of heat conducting bodies while maintaining the mass production capability.

For example, in flexible heat conducting bodies having mutually combined plane fins disclosed in the aforementioned Japanese Unexamined Patent Publication No. 57-103337, the thermal resistance is as large as approximately 2.5° C.·cm²/W per unit sectional area. With such an arrangement, it is difficult to cool a module having a high heat flux of a 50 W/cm² class. Although it is basically important to decrease clearances between fins in heat conducting bodies having opposed heat conducting faces for lowering the thermal resistance, a clearance between the fins in this known example is as large as 200 μm. Sufficient consideration has not therefore been given to lowering the thermal resistance to adequately cool a semiconductor module of the 50 W/cm² class. In this example, the thickness of the fins is as thin as 0.2 mm, the height of the fin is 10 mm, which is not suitable for mass production because the height thereof is too high.

Further, in the example of the flexible heat conducting bodies disclosed in the aforementioned Japanese Unexamined Patent Publication No. 60-126853, the thermal resistance per unit sectional area, at a minimum, is approximately 1.2° C.·cm²/W. When such known flexible heat conducting bodies are utilized in the semiconductor module of the 50 W/cm² class, a temperature difference of approximately 60° C. is caused even at portions of the heat conducting bodies. Thus, it is extremely difficult to keep the temperature rise from the room temperature or the temperature of cooling water to an acceptable 50° through 65° C. or less. In addition, in this conventional arrangement, the clearance between fins is about 25 through 200 μm and representatively, 50 μm. The thickness of a fin is in a range of 0.2 through 2.6 mm and the height of a fin is in a range of approximately 3 through 10 mm.

The flexible heat conducting bodies disclosed in aforementioned U.S. Pat. No. 4,800,956 utilize a manner wherein the thickness of the fin is made equal to the clearance between the fins. A thermal resistance value of approximately 1.0° C.·cm²/W per unit sectional area is provided by combining copper fins having a fin thickness of 69 μm, a fin height of 7.38 mm and a fin clearance of 69 μm. A temperature difference of approximately 50° C. is caused even at portions of the heat conducting bodies when they are applied to semiconductor module of a 50 W/cm² class. Thus, here too it is difficult to keep the temperature rise from the room temperature or the temperature of a cooling water to an allowable maximum value of 50° through 65° C. It is also very difficult to accurately manufacture a thin, tall fin having a fin thickness of 69 μm, and a fin height of 7.38 mm. Therefore the mass production capability is degraded.

The flexible heat conducting bodies disclosed in the aforementioned U.S. Pat. No. 4,498,530, utilize a method wherein the clearance between fins is half of the thickness of the fin. The thermal resistance is not disclosed, however, that known arrangement has a structure wherein a large number of thin, flexible fins with a thickness of 5.08 through 127 μm are laminated via spacers. Additionally, the mass production capability is insufficient.

Another problem of insufficiency in known heat conducting bodies, is the relationship between an amount of a heat conducting medium enclosed in a semiconductor module and an attitude of the semiconductor module when it is mounted. This problem becomes important in case where the cooling medium is a liquid such as oil. The advantage of using oil lies in the fact that the cooling efficiency is higher than that obtained when using a gas such as helium.

For example, in a structure described in the aforementioned IBM Journal of Research and Development Vol. 35 No. 3 (1991), an expansion absorbing chamber is provided in a semiconductor module to avoid an extreme increase of internal pressure of the semiconductor module by thermal expansion of oil. It is necessary to reduce the size of the semiconductor module as much as possible in view of the increasing computer processing speeds. However, here the size of the semiconductor module is necessarily enlarged because it has been necessary provided the expansion absorbing chamber.

Sufficient consideration has not been given in the conventional technology to the enclosed amount of oil, and the structure for enclosing the oil. Also it is insufficient to be considered the attitude of the mounted semiconductor module. This is suitable for the semiconductor module with the heat conducting bodies having mutually combined plane fins to make possible a reduction in size of the semiconductor module.

It is an object of the present invention to provide a semiconductor module which solves the above-mentioned problems, achieves a high cooling function, and maintains excellent mass production capability.

It is another object of the present invention to provide a semiconductor module which is small and yet has highly effective heat radiating structure.

To achieve the above-mentioned objects, the present invention provides a low thermal resistant, fluid-cooled semiconductor module comprising a circuit board, semiconductor devices having a first surface for mounting on the circuit board and a second surface opposed to the first surface, a housing associated with the circuit board, first heat conducting members, each of which has first heat transfer surfaces extending perpendicular to the second surface of the semiconductor devices, disposed between the semiconductor devices and the housing, and second heat conducting members, each of which has heat transfer surfaces extending perpendicular to the second surface of the semiconductor devices, disposed between the semiconductor devices and the housing, wherein the first and second heat transfer surfaces are arranged opposite to each other to form a clearance therebetween of about 5 to 25 μm.

It is advantageous that the first heat transfer surface of the first heat conducting members comprises first fins, the second heat transfer surface of the second heat conducting members comprises second fins. A thickness of the first fins and the second fins may be within a range of about 0.3 to 0.5 mm and a height of the first fins and the second fins may be within a range of about 1.5 to 4 mm.

It is still another advantage to provide a cooling liquid within a sealed space defined by the housing and the circuit board, and a level of the cooling liquid is set between upper and lower ends of the first heat conducting member provided on an uppermost one of the semiconductor devices, with a longitudinal direction of the first fins and the second fins arranged substantially vertically.

Preferably at least one valve mechanism is provided at an end of the semiconductor module for introducing and removing the cooling liquid.

To achieve the aforementioned objects and advantages, present invention also provides a low thermal resistant, fluid-cooled semiconductor module comprising, a circuit board, semiconductor devices mounted on the circuit board and having a semiconductor surface opposed to the circuit board, a housing which is associated with the circuit board and having an integrated radiator at an outer surface thereof and a flat inner surface, first heat conducting members having first fins and a base disposed between the semiconductor devices, and second heat conducting members having a base and second fins disposed between the first heat conducting members and the housing, and wherein the first and second fins are arranged in an alternating manner with a clearance defined therebetween. It is preferable that the base of the first heat conducting member is secured to the semiconductor device, the first fins are arranged parallel to each other, and the first fins are perpendicular to and integrated with the base. It is also preferable that an area of the base of the second heat conducting member is substantially the same as an occupied area within the circuit board of respective semiconductor device, the second fins are arranged parallel to each other, and the second fins are perpendicular to and integrated with the base.

It is also advantageous that elastic members are provided between the first heat conducting members and the second heat conducting members to cause at least one surface of the first heat conducting members opposed to the housing to contact an inner wall of the housing, and wherein the first and second fins have a thickness in a range of about 0.3 to 0.5 mm, a height in a range of about 1.5 to 4 mm with the clearance between the alternating first and second fins being in a range of about 5 to 25 μm.

It is still of further advantage that a flange is coupled with the circuit board and is mounted to the housing. An introducing valve is disposed at either of the housing or the flange for introducing the cooling fluid to the module, and a removing valve is disposed at either of the housing or the flange for removing the cooling fluid from the module. Preferably the cooling fluid is heat conductive and electrically insulative liquid.

It is advantageous that at least one of the first and second heat conducting members is made of aluminum nitride, and the first and second fins extend substantially horizontal. Preferably a level of the cooling liquid is set to be between an uppermost fin and a lowermost fin of an uppermost one of the first heat conducting members, with the module disposed substantially vertically.

It is of further advantage that at least one groove is formed on the inner surface of the housing beyond an area of the second heat conducting members, and bases of the second heat conducting members have at least one hole communicating between a gap formed by the first fins and the second fins and the at least one groove.

BRIEF DESCRIPTION OF THE DRAWINGS

These and other objects, advantages and novel features of the present invention will become more readily apparent from the following detailed description of the invention when taken in conjunction with the accompanying drawings wherein:

FIG. 3 is a graph showing calculated thermal resistance in relation to fin height in the embodiment of the module shown in FIG. 1;

FIG. 10 is a longitudinal sectional view of a semiconductor module showing still another modified embodiment of the present invention.

DESCRIPTION OF THE PREFERRED EMBODIMENTS

Figure 1:
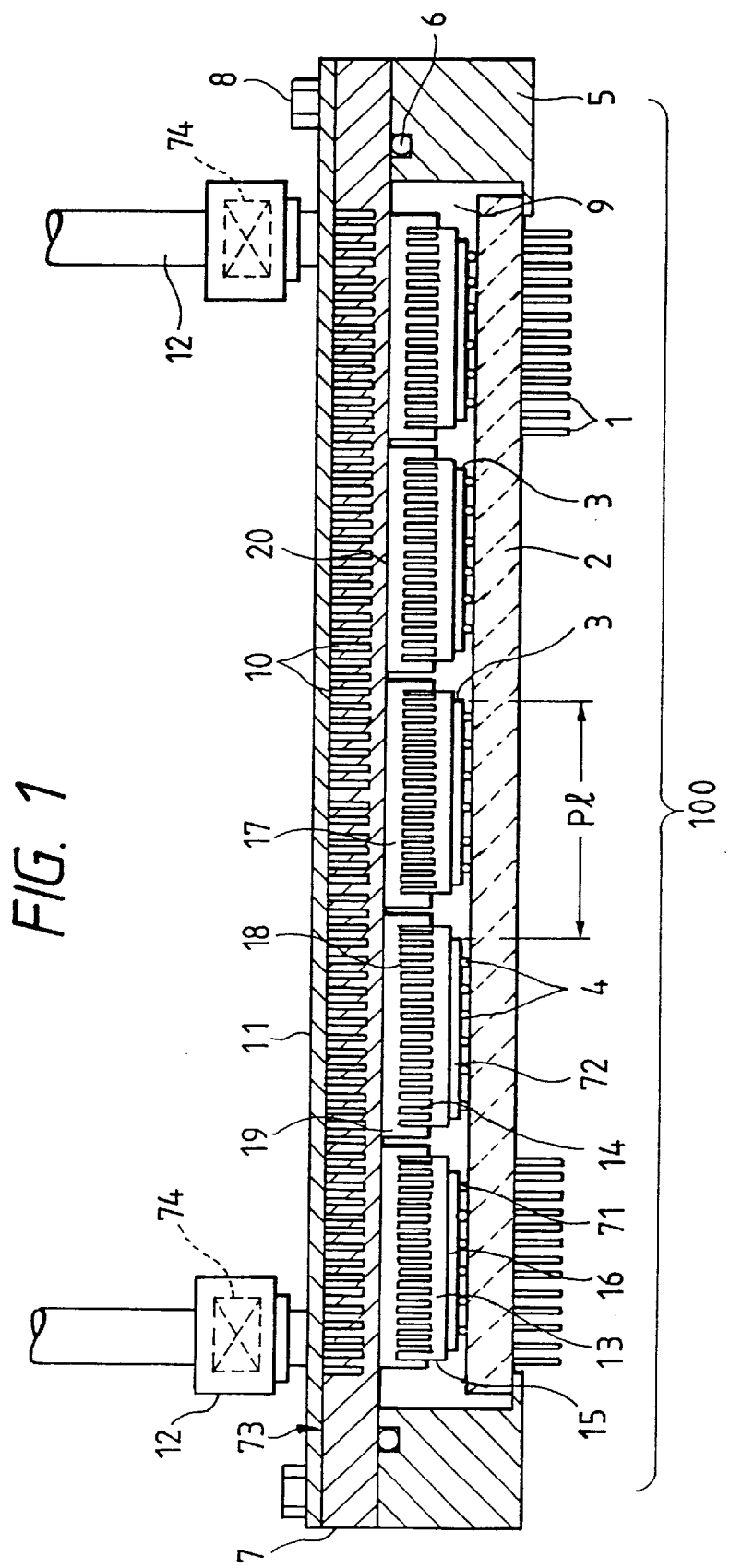
FIG. 1 is a schematic longitudinal sectional view of a semiconductor module showing an embodiment of the present invention.

First, explanation will be given of the embodiment of the present invention shown in FIG. 1 and with reference to FIGS. 2A and 2B, and also FIG. 3. A semiconductor module 100 comprises a plurality of semiconductor devices 3 mounted on a ceramic multi-layered circuit board 2 and having a number of I/O pins 1 via very small solder balls 4. A first surface 71 of each semiconductor device 3 faces to the circuit board 2. A second surface 72 of each semiconductor device 3 faces opposite to the first surface 71. Flanges 5 are attached to the circuit board 2, and the flanges 5 are fixed by bolts 8 to a housing 7 via O-rings 6. The housing 7, the flanges 5 and the circuit board 2 define a space 9, and the space 9 is sealed in an airtight state with helium gas or liquid such as an electrically insulative oil enclosed therein. A plurality of flow paths 10 flowing a cooling fluid is integrally formed with the housing 7 on the top end face 73 of the housing 7 and an upper lid 11 is attached to the top end face 73 covering the flow paths 10. Further, couplers 12 each incorporating a valve mechanism 74 are provided at the housing 7 or at the upper lid 11 and the cooling fluid flows in from the outside or flows out to the outside via the couplers 12.

A first heat conducting member 15 is fixed to the semiconductor device 3 at the second surface 72 thereof by a solder layer 16. As shown in FIG. 2A, the first heat conducting member 15 has a base 13 and a plurality of first plate fins 14 formed integrally with the base 14 and vertically on the base 13. The first plate fins have a thickness (Th) and a height (h), and form first heat conducting surfaces. It is preferable that the material of the first heat conducting member 15 is electrically insulative and thermally conductive and its coefficient of linear expansion is near to that of the material of the semiconductor device 3. One such material is, for example, aluminum nitride (AlN).

Figure 2A:
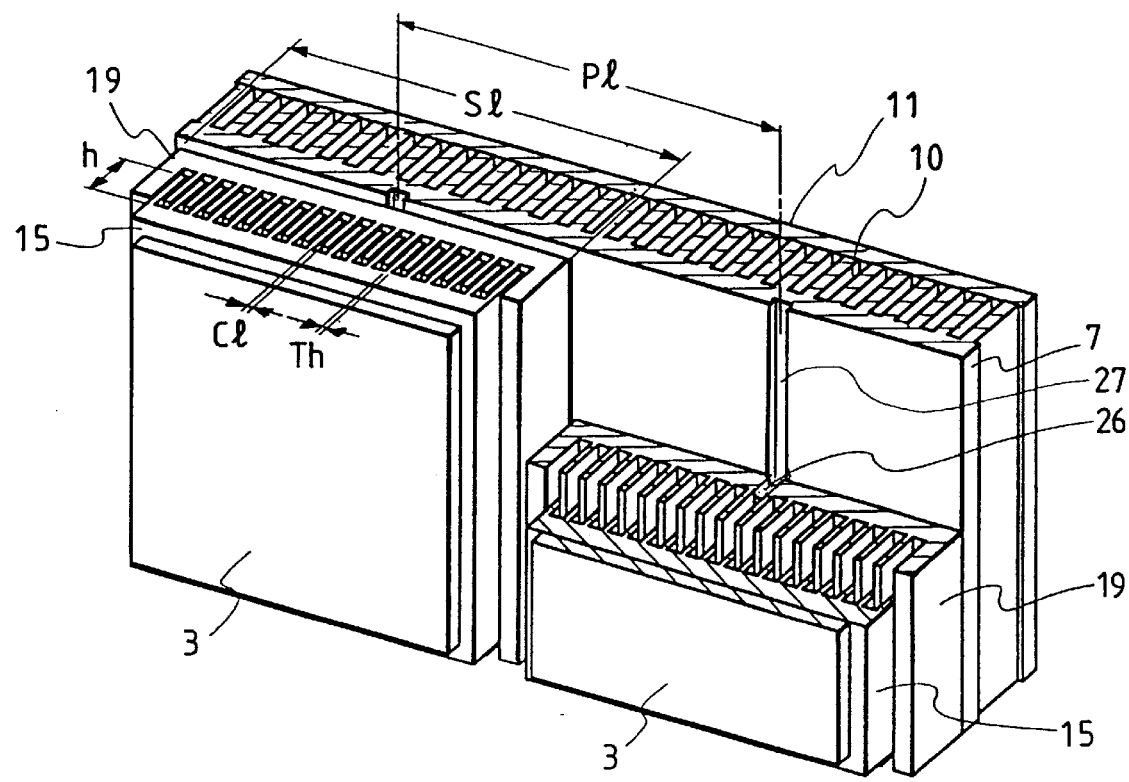
FIG. 2A is a partially sectioned schematic perspective view of an enlarged semiconductor module of the present invention shown FIG. 1.
Figure 2B:
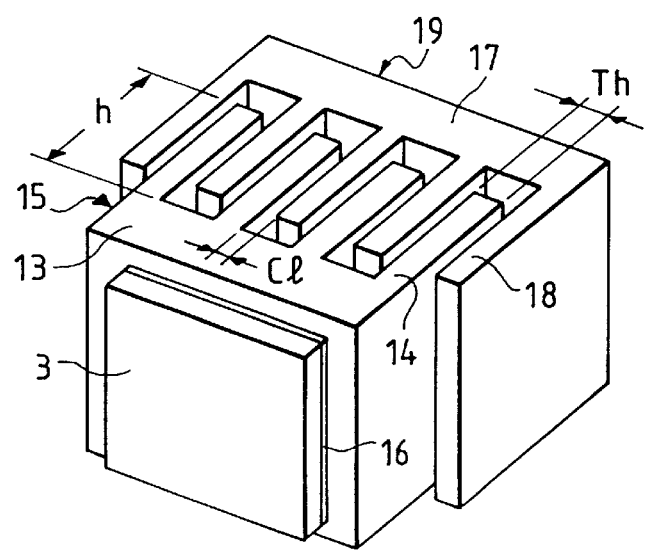
FIG. 2B is a schematic perspective view of a first and a second heat conducting members of the present invention shown in FIG. 1.

A second heat conductive member 19 also having a base 17 and a plurality of second plate fins 18 is engaged with the first heat conducting member 15 via very small clearance (Cl) forming a single heat conducting body by being coupled with the first heat conducting member 15 as shown in FIG. 2B. The second plate fins 18 also have a thickness (Th) and a height (h), and form second heat conducting surfaces. A side length (Sl) of the second heat conducting member 19 is approximately equal to a pitch (Pl) between the semiconductor devices 3 when the respective semiconductor devices 3 are mounted on the circuit board 2, and the area of the base 17 is larger than that of the semiconductor device 3.

The base 17 of the second heat conducting member 19 is pushed on a flat inner wall 20 of the housing 7 by an elastic member (not shown) comprised of, for example, a spring provided between the first heat conducting member 15 and the second heat conducting member 19. A portion of the inner wall of the housing 7 in contact with the base 17 of the second heat conducting member 19 acts as a heat transfer member, and absorbs thermal deformation of the semiconductor module 100 by sliding a surface of the base 17 in contact with the portion of the inner wall 20.

With respect to the dimension of the first fins 14 in the first heat conducting member 15 and the second fins 18 in the second heat conducting member 19 in this example, the fin thickness (Th) is about 0.3 through 0.5 mm, the fin height (h) is about 1.5 through 5 mm and the clearance (Cl) between the fins is about 5 through 25 μm. As shown in FIG. 2A, the housing 7 has longitudinal grooves 27 corresponding to the second heat conducting members 19. A pitch (Pl) between these grooves is a range of about 10 to 30 mm, and a width (Sl) of each second heat conducting member is also in a range of about 10 to 30 mm.

In the embodiment of FIG. 1, there is no non-uniformity of the contact thermal resistance caused by warping of a face of the semiconductor device 3 which has been difficult to avoid with conventional technology, because the first heat conducting member 15 is fixed thereto by the solder layer 16.

Namely, in this embodiment, the semiconductor module is assembled by the steps described as follows.

At first, the respective semiconductor devices and the respective first heat conducting members are soldered each other, and these are soldered with solder balls 4 to the circuit board 2. Then, a spring is inserted in a gap formed in a center portion of the each first heat conducting member.

Second, using the springs the second heat conducting members 19 are engaged with the first heat conducting members 15. Hence, the second heat conducting members are restricted with their horizontal motion by the second fins 18 and the springs.

Third, the circuit board is covered with the housing and is fixed by bolts 8 and flanges 5. Thus, the clearance between the first and second fins can be made in a range of about 5 to 25 μm.

In this embodiment, a inclination of the semiconductor devices or thermal deformation of semiconductor devices are corrected by a inclination of the first and second fins, therefore the semiconductor module can be cooled uniformly.

Further, the area of the base 17 of the second heat conducting member 19 is approximately equal to an area on the substrate 2 occupied by the semiconductor device 3 and is larger than the area of the semiconductor device 3. Therefore, the contact area is large in comparison with a situation in which the heat conducting member is brought into contact with a face of the device.

Both the inner wall 20 of the housing 7 and the base 17 of the second heat conducting member 19 are formed as flat faces which are easy to work and machine. Hence, the warp can be restrained very easily. As a result, the contact thermal resistance between the flat inner wall 20 of the housing 7 and the base 17 of the second heat conducting member 19 is minimized. The fin thickness is also comparatively thick, the clearance between the fins is reduced and the fin height is lowered. Thus, the working of the first and second heat conducting members 15, 19 is facilitated and the thermal resistance can be made extremely small.

FIG. 3 shows the calculated results of thermal resistance per unit sectional area of a heat conducting body used in the embodiment of FIG. 1. The abscissa designates a fin height (h) and ordinate designates thermal resistance (r) per unit sectional area. Here, the material of the first fin is aluminum nitride (Al), the material of the second fin is copper (Cu) and the heat conducting fluid enclosed in the space is a mineral oil. The clearance (Cl) between the fins is a parameter for each curve. We have recognized that attention must be paid to a narrow clearance having a region of 5 through 25 $\mu$m which has not up to now been investigated in conventional heat conducting bodies. Attention is also paid to a fin thickness having a comparatively thick region whereby the working of the fin is facilitated and in this embodiment the fin thickness (Th) is determined as 0.5 mm. An extremely low thermal resistance (r) of 0.5° C. through 0.75° C.·cm$^2$/W per unit sectional area can be provided even in using such a comparatively thick fin by utilizing the narrow clearance region.

By utilizing above-described narrow clearance region, the fin height (h) minimizing the thermal resistance (r) is about 1.5 through 4 mm which is lower than that of conventional heat conducting bodies, and a working of the fin is further facilitated. Although the fin thickness is 0.5 mm in the calculation shown in FIG. 3, it is preferable that the fin thickness (Th) is in a range of about 0.3 through 0.5 mm for greater working ease. Materials for the first and second fins, other than the above-mentioned materials can include, for example, aluminum nitride (AlN), silicon (SiO$_2$) and the like for both of the fins.

Figure 4:
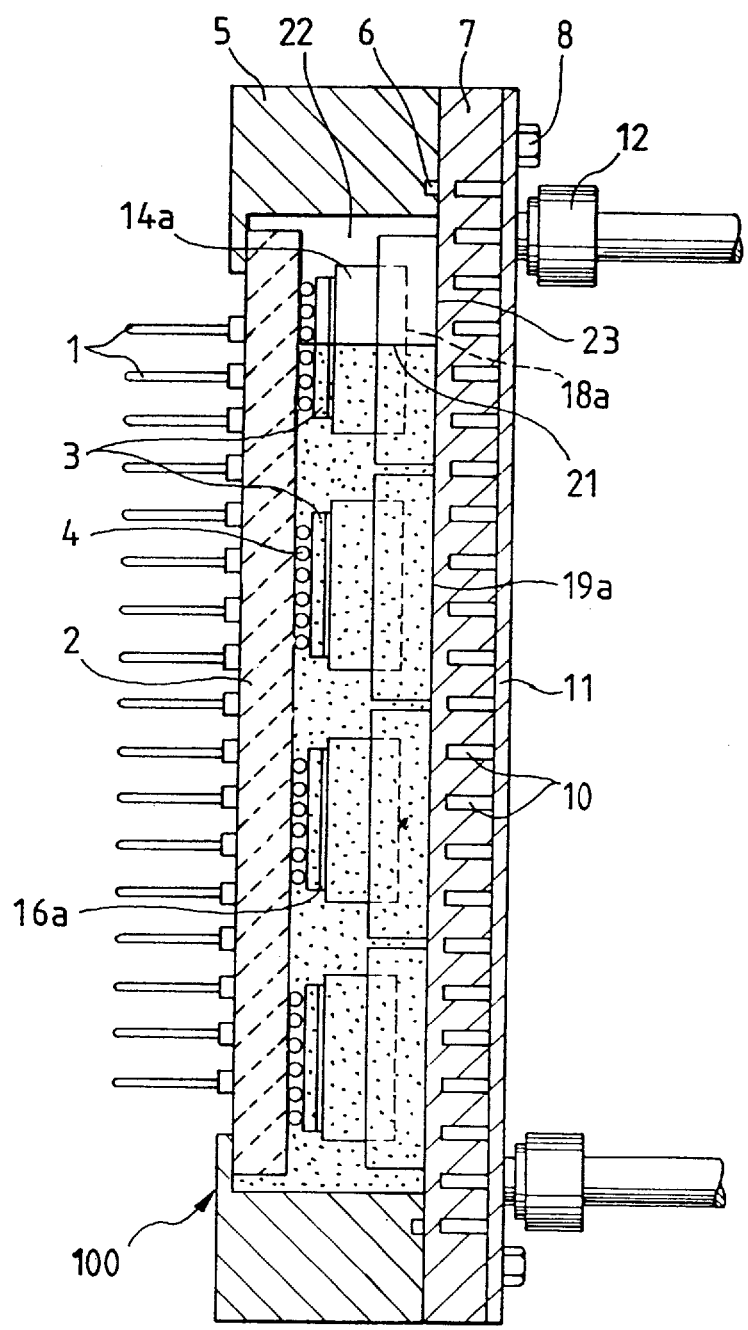
FIG. 4 is a schematic longitudinal sectional view of a modified embodiment of a semiconductor module of the present invention.
Figure 5:
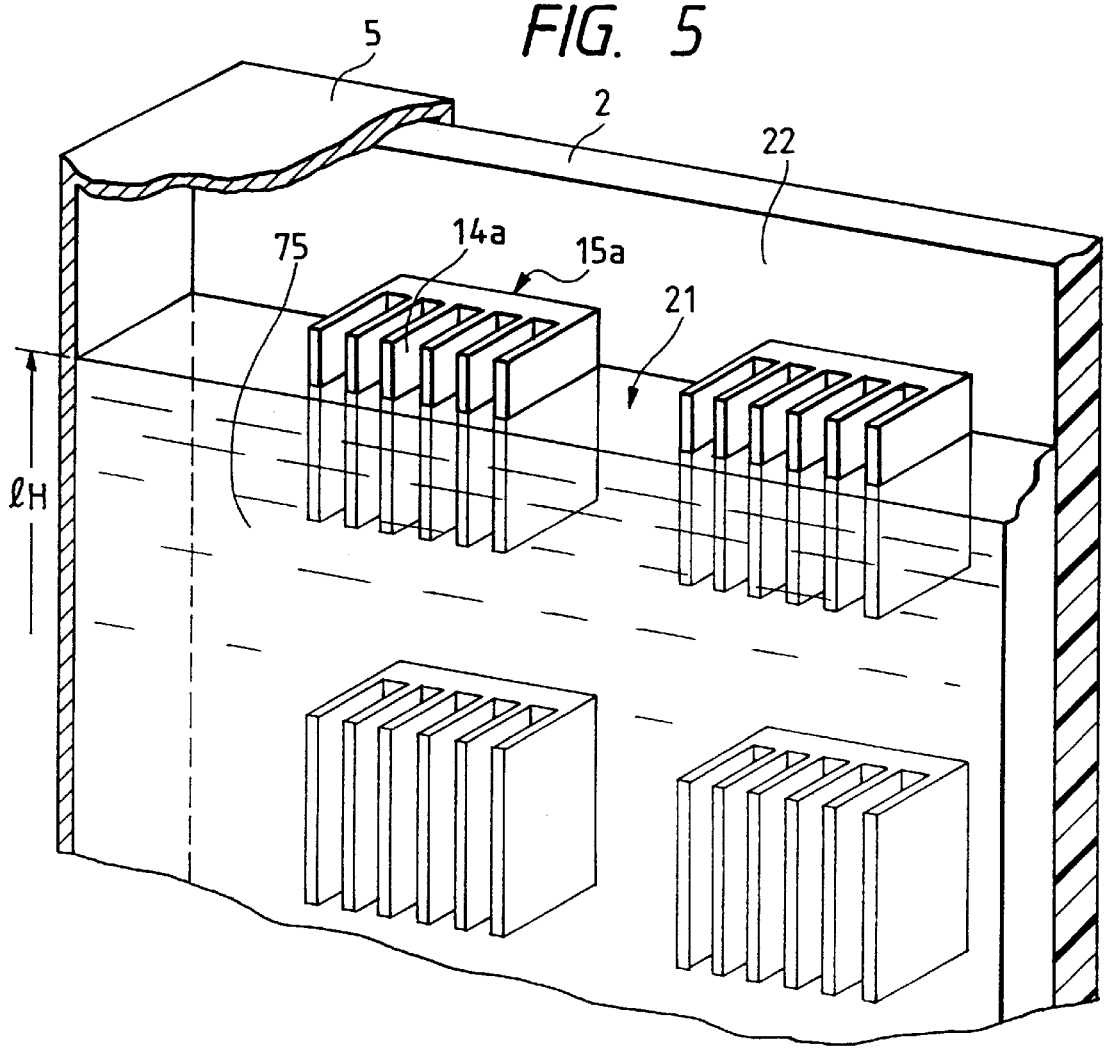
FIG. 5 is a schematic perspective view of an enlarged top portion of a semiconductor module of the present invention shown in FIG. 4.

In FIGS. 4 and 5, a liquid with excellent heat conductivity and electrically insulative performance is utilized as a heat conducting fluid. Such a liquid is, for example, a mineral oil.

A semiconductor module 100 is constructed such that the longitudinal direction of the first fins 14a and the second fins 18a is substantially vertical. The amount of liquid is controlled such that a liquid level 21, namely $l_H$, of the enclosed liquid 75 is at a height between the lowermost and the uppermost position of the first fins 14a of a first heat conducting member 15a fixed to a semiconductor device 3 located at the uppermost portion of the semiconductor module 100. A space 22 formed in the semiconductor module in which no liquid is present, is filled with an inert gas such as nitrogen gas (N$_2$).

Figure 6:
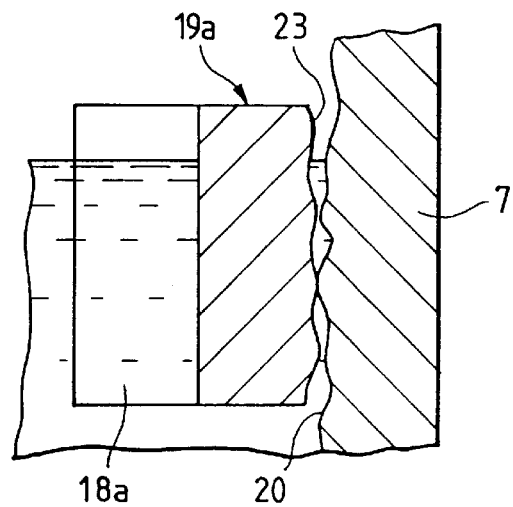
FIG. 6 is a schematic longitudinal sectional view of a second heat conducting member and a housing shown in FIG. 4.

In this embodiment, the space for absorbing liquid expansion can be formed in the semiconductor module while supplying the liquid 75 between the fins 14a, 18a and contact faces 23 of the second heat conducting members 19a in contact with the inner walls 20 of the housing 7 (as shown in FIG. 6). Thus, an extra expansion absorbing chamber is unnecessary. The semiconductor module 100 can be reduced in size while providing higher cooling function by the heat conducting fluid using the liquid. Although a very small gap of approximately several $\mu$m is formed between the second heat conducting member 19a and the inner wall 20 of the housing 7 which is formed by the surface roughness, the above effect is provided because the heat conducting fluid permeates through the very small gap.

Figure 7A:
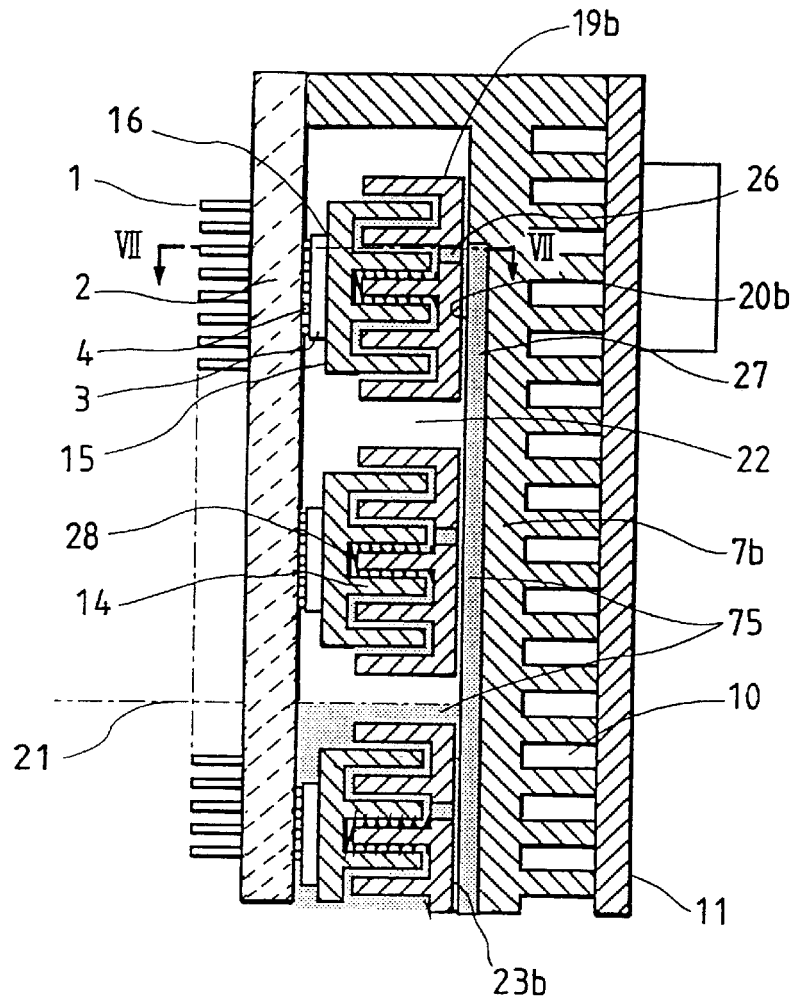
FIG. 7A is a schematic longitudinal sectional view of a upper portion of a semiconductor module showing yet another modified embodiment of the present invention.
Figure 7B:
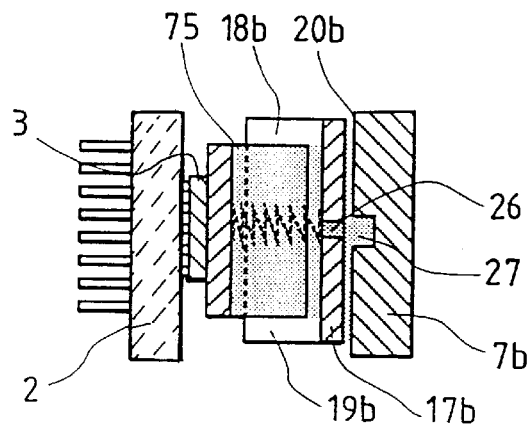
FIG. 7B is a fragmentary cross sectional view taken along line VII—VII of FIG. 7A.
Figure 8:
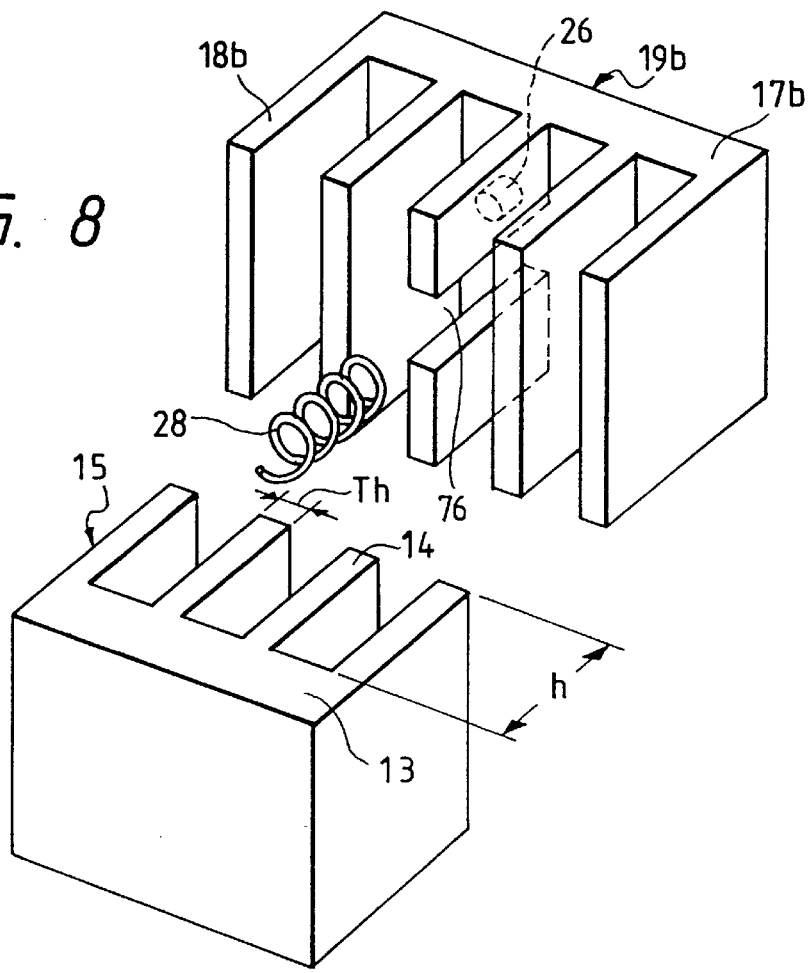
FIG. 8 is a schematic enlarged view of the present invention shown in FIG. 7, showing a first and second heat conducting members with a elastic body.

In addition, the liquid level 21 may be between a center of the upper and the lower ends and the upper end of the first heat conducting member located uppermost portion of the semiconductor module. In that situation, the semiconductor module is more entirely covered with liquid, so that cooling function by the heat conducting fluid is still more improved. FIG. 7A through FIG. 9 shows another embodiment of the present invention which is different from the above-described embodiments of FIG. 1 and FIG. 4 in the following ways. That is, a very small hole 26 penetrating from a contact surface 23b of the second heat conducting member 19b that is brought into contact with the housing 7b to the root of the second fin 18b is provided in the base 17b of the second heat conducting member 19b, and very small longitudinal grooves 27 are provided on the inner wall 20b of the housing 7b such that the grooves include portions of the inner wall which are covered with the second heat conducting members 19b. Namely, the grooves are formed such that at least one groove is faced to each semiconductor device. A liquid 75 excellent both in the heat conductivity and the electrically insulative performance is enclosed in the semiconductor module 100 as shown in FIG. 7A and 7B, and the amount of liquid is controlled such that the liquid level 21 is in contact with at least the very small grooves 27 provided on the inner wall 20b of the housing 7b. The semiconductor module 100 is in a vertical arrangement wherein the longitudinal direction of the very small grooves 27 is substantially vertical. The second heat conducting members 19b are pushed on the housing 7b by elastic bodies 28, each is engaged in a gap 76 formed between at least one of second fins 18b and is composed of, for example, a helical spring.

Figure 9:
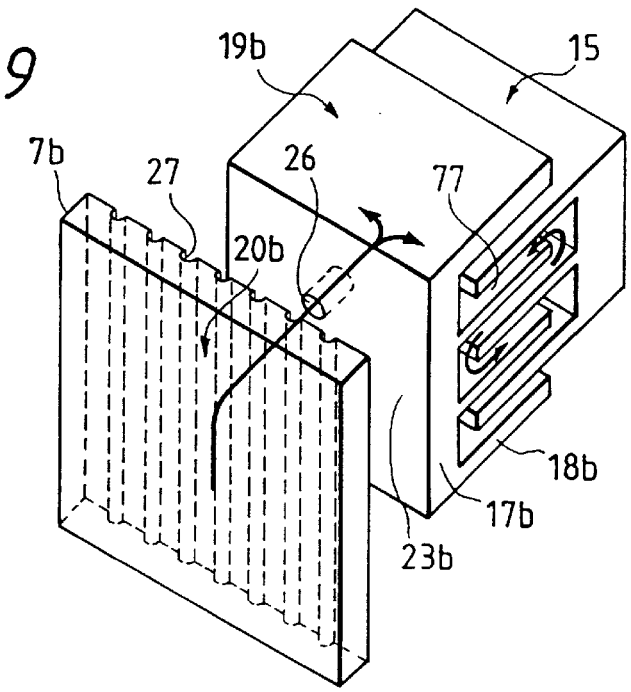
FIG. 9 is a schematic enlarged view of a second heat conducting member and housing shown in FIG. 7.

In the modified embodiment constructed as above, the enclosed liquid 75 is transferred like an arrow shown in FIG. 9. Namely, the liquid comes up through the very small grooves 27 formed in the housing 7b by the surface tension of the liquid. Then, the liquid is supplied to the clearances 77 between the first fins 14 and the second fins 18b successively through the contact faces 23b of the second heat conducting members 19b in contact with the inner walls 20b of the housing 7b and the very small holes 26 provided in the second heat conducting member 19b. Hence, the expansion absorbing chamber is unnecessary, a reduction in size of the semiconductor module can be achieved, and the cooling function is promoted by using the liquid cooling.

FIG. 10 shows a still another embodiment of the present invention in which valve mechanisms 24 and 25 provided at two portions of the flange 5 introduce the heat conducting fluid into the semiconductor module or remove it therefrom. The valve mechanisms 24, 25 are set parallel with the longitudinal direction of the first fins 14 and the second fins 18 and are arranged in the flange defining the space formed in the semiconductor module 100.

The semiconductor module of FIG. 10 is used in a vertical arrangement wherein the longitudinal direction of the first fins 14 and the second fins 18 is set vertical. The valve 24 is disposed on the top portion, and the valve 25 is disposed on the bottom portion of the module. In introducing the liquid into the semiconductor module 100, valves 24, 25 are opened and the liquid is introduced into the bottom of the semiconductor module via the valve 25. Because the valve 24 is disposed at the uppermost portion, air remaining in the semiconductor module can be exhausted from the valve 24 as the liquid level 21 rises. A longitudinal direction of the first fins 14 and second fins 18 is vertical, only a small amount of air will be trapped in the clearances among the fins 14, 18 and, therefore, a stable cooling function can be achieved.

Meanwhile, in removing the cooling liquid from the inside of the semiconductor module 100, the previously closed valves 24, 25 are opened, and the cooling liquid is removed through the valve 25 while, at the same time, air is introduced into the semiconductor module via the valve 24. In this way, removal of the cooling liquid is greatly facilitated and disassembly of the semiconductor module for maintenance purposes is also facilitated.

As a result, the following advantages are provided by the present invention as constructed in the manner explained above.

First, the working of the fins is facilitated and also an extremely high cooling function can be provided by forming the fin of the heat conducting body relatively thick, decreasing the clearances among the fins and decreasing the fin height.

Second, where the semiconductor module is used in a vertical arrangement wherein the longitudinal direction of the first and the second fins is substantially disposed in the vertical direction, the amount of cooling liquid is controlled such that the level of the cooling liquid enclosed in the semiconductor module is at the height between the upper and the lower ends of the first heat conducting member located at the uppermost portion of the semiconductor module, preferably, at the height between the center of the upper and the lower ends of the heat conducting member and the upper end thereof. Therefore, an extra expansion absorbing chamber is unnecessary and the semiconductor module can be reduced in size while providing a high cooling function.

Third, in one embodiment of the present invention, very small holes penetrating from the faces of the bases of the second heat conducting members in contact with the housing to the roots of the second fins, are provided at the bases of the second heat conducting members. A plurality of very small longitudinal grooves are provided on the inner wall of the housing such that the grooves have portions of the inner wall covered with the second heat conducting members. Thus, the amount of the cooling liquid is controlled so that at least the liquid level of the enclosed liquid is brought into contact with the very small vertical grooves provided on the inner wall of the housing and the semiconductor module is used in the vertical arrangement wherein the longitudinal direction of the grooves is vertical. In this embodiment, the cooling liquid is supplied from the very small grooves to gaps between the first fins and the second fins successively via the contact faces of the bases of the second heat conducting members in contact with the inner wall of the housing and the very small holes provided at the bases of the second heat conducting members. Thereby, an extra expansion absorbing chamber is dispensed with, a semiconductor module having high cooling function using the liquid as the heat conducting medium can be realized and the semiconductor module can further be reduced in size.

Fourth, the valve mechanisms for introducing the liquid into the semiconductor module and exhausting it therefrom are provided at portions of the top face and the bottom face of the space formed in the semiconductor module. The valve mechanisms are arranged parallel with the longitudinal direction of the first fins and the second fins. Therefore, the introduction of the cooling liquid into the semiconductor module and the removal thereof from the semiconductor module are greatly facilitated.

Although the invention has been described in its preferred form with a certain degree of particularly, it is understood that the present disclosure of the preferred form has been changed in the details of construction and the combination and arrangement of parts may be resorted to without departing from the spirit and the scope of the invention as hereinafter claimed.

What is claimed is:

1. A low thermal resistant, fluid-cooled semiconductor module comprising:
   a circuit board;
   a plurality of semiconductor devices having a first surface for mounting on said circuit board and a second surface opposed to said first surface;
   a housing associated with said circuit board;
   first heat conducting members, each of which has a plurality of first heat transfer surfaces perpendicular to the second surface of the semiconductor devices, disposed between said semiconductor devices and said housing; and
   second heat conducting members each of which has a plurality of second heat transfer surfaces perpendicular to the second surface of the semiconductor devices, disposed between said semiconductor devices and said housing,
   wherein the first and second heat transfer surfaces are arranged opposite to each other to form a clearance therebetween of substantially from 5 to 25 $\mu$m, a thickness of the first fins and the second fins is within a range of 0.3 to 0.5 mm and a height of the first and the second fins is within a range of 1.54 to 4 mm.

2. The low thermal resistant, fluid-cooled semiconductor module according to claim 1,
   wherein the plurality of the first heat transfer surface of the first heat conducting members comprises first fins, the plurality of the second heat transfer surface of the second heat conducting members comprises second fins, and the plurality of the first and the second fins form the clearance.

3. The low thermal resistant, fluid-cooled semiconductor module according to claim 1,
   wherein a cooling liquid is provided within a sealed space defined by said housing and said circuit board, and a level of said cooling liquid is set between uppermost fins of said first heat conducting member and said second heat conducting member disposed on an uppermost one of said semiconductor devices, and lowermost fins of said first heat conducting member and said second heat conducting member disposed on the uppermost semiconductor device, with a longitudinal direction of the first fins and the second fins being arranged substantially vertically.

4. The low thermal resistant, fluid-cooled semiconductor module according to claim 1,
   wherein at least one valve mechanism is provided at an end of the semiconductor module for introducing and removing a cooling liquid.

5. A low thermal resistant, fluid-cooled semiconductor module comprising:
   a circuit board;
   plurality of semiconductor devices mounted on said circuit board, having a semiconductor surface opposed to said circuit board;
   a housing associated with the circuit board and having an integrated radiator at an outer surface thereof and a flat inner surface;
   first heat conducting members disposed between said semiconductor devices and said housing, each said first heat conducting member having a base which is secured to said semiconductor device, and a plurality of first fins arranged parallel to each other and perpendicular to and integrated with the base; and second heat conducting members disposed between said first heat conducting members and said housing, each said second heat conducting member having a base which area is substantially the same as an occupied area within said circuit board of respective semiconductor device, and a plurality of second fins arranged parallel to each other and perpendicular to and integrated with the base, and wherein the first fins and the second fins are arranged in an alternating manner with a clearance of from 5 to 25 μm defined therebetween a thickness of the first fins and the second fins is within a range of 0.3 to 0.5 mm and a height of the first and the second fins is within a range of 1.54 to 4 mm.

6. The low thermal resistant, fluid-cooled semiconductor module according to claim 5, wherein a plurality of elastic members are provided between said first heat conducting members and said second heat conducting members to cause at least one surface of said second heat conducting members opposed to said housing to contact an inner wall of said housing.

7. The low thermal resistant, fluid-cooled semiconductor module according to claim 6, wherein cooling liquid is provided in a space defined by said circuit board and said housing, said cooling liquid being heat conductive and electrically insulating.

8. The low thermal resistant, fluid-cooled semiconductor module according to claim 7, wherein a flange is coupled to said circuit board and is mounted to said housing, an inlet valve is disposed at one of said housing and said flange for introducing said cooling liquid to said module, and a removing an exhaust valve is disposed at another of said housing and said flange for removing said cooling liquid from said module, said inlet valve and an exhaust valve being spaced with respect to the first and second fins.

9. The low thermal resistant, fluid-cooled semiconductor module according to claim 7, wherein at least one of said first and second heat conducting members is made of aluminum nitride.

10. The low thermal resistant, fluid-cooled semiconductor module according claim 7, wherein the first and second fins extend substantially vertical, and a level of the cooling liquid is set to be between an upper end and a lower end of an uppermost one of the first heat conducting members, with the module disposed substantially vertically.

11. The low thermal resistant, fluid-cooled semiconductor module according to claim 7, wherein at least one groove is formed on the inner surface of said housing beyond an area of said second heat conducting members, and said second heat conducting members have at least one hole to permit the cooling liquid to flow between a gap formed between the first fins and the second fins and the at least one groove on the housing.

12. The low thermal resistant, fluid-cooled semiconductor module according to claim 8, wherein a distance between said introducing valve and said removing valve is substantially the same as a length of said circuit board.

13. The low thermal resistant, fluid-cooled semiconductor module according to claim 10, wherein a level of said cooling liquid is set between an upper end and a center of the upper end and a lower end of an uppermost one of said first heat conducting members.

14. The low thermal resistant, fluid-cooled semiconductor module according to claim 11, wherein a level of said cooling liquid is sized to contact the groove, with a longitudinal direction of the groove being arranged substantially vertically.

15. The low thermal resistant, fluid-cooled semiconductor module according to claim 13, wherein the distance is a vertical distance.

* * * * *